US010049719B1

United States Patent
Hsu (10) Patent No.: US 10,049,719 B1
(45) Date of Patent: Aug. 14, 2018

(54) VOLTAGE SYSTEM AND METHOD FOR OPERATING THE SAME

(71) Applicant: NANYA TECHNOLOGY CORPORATION, New Taipei (TW)

(72) Inventor: Ting-Shuo Hsu, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 15/620,212

(22) Filed: Jun. 12, 2017

(51) Int. Cl.
  *G11C 7/00* (2006.01)
  *G11C 11/4074* (2006.01)

(52) U.S. Cl.
  CPC ................ *G11C 11/4074* (2013.01)

(58) Field of Classification Search
  CPC .................................. G11C 11/4074
  See application file for complete search history.

(56) References Cited

U.S. PATENT DOCUMENTS

| 2001/0017553 A1* | 8/2001 | Saito | G11C 5/147 326/1 |
| 2002/0054531 A1* | 5/2002 | Aruga | G11C 5/145 365/226 |
| 2008/0273413 A1* | 11/2008 | Horiguchi | G11C 5/063 365/226 |

\* cited by examiner

*Primary Examiner* — Hoai V Ho
(74) *Attorney, Agent, or Firm* — Muncy, Geissler, Olds & Lowe, P.C.

(57) ABSTRACT

The present disclosure provides a voltage system of a DRAM and a method for operating the same. The voltage system includes a first regulator, a second regulator and a control device. The control device determines the amount of regulators required based on an operation mode which the DRAM is instructed to operate under, and, based on the determination, enables one or more regulators between the first regulator and the second regulator and disables the remaining regulators. The amount of the one or more enabled regulators is equal to the determined amount of regulators required. The one or more enabled regulators provide a current which serves as an operation current of a bank of the DRAM.

11 Claims, 10 Drawing Sheets

VOLTAGE SYSTEM AND METHOD FOR OPERATING THE SAME

TECHNICAL FIELD

The present disclosure relates to a voltage system, and more particularly, to a voltage system which includes a plurality of regulators.

DISCUSSION OF THE BACKGROUND

Voltage regulators (VRs) are generally used in power delivery applications where an input voltage needs to be transformed to an output voltage in ratios that range from smaller than unity to greater than unity.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a voltage system of a DRAM. The voltage system includes a first regulator, a second regulator and a control device. The control device determines the amount of regulators required based on an operation mode which the DRAM is instructed to operate under, and, based on the determination, enables one or more regulators between the first regulator and the second regulator and disables the remaining regulators. The amount of the one or more enabled regulators is equal to the determined amount of regulators required. The one or more enabled regulators provide a current which serves as an operation current of a bank of the DRAM.

In some embodiments, when the operation mode is a first operation mode, the control device, based on the first operation mode, enables the first regulator and the second regulator, and the first regulator and the second regulator provides the bank with a first current and a second current, respectively. When the operation mode is a second operation mode different from the first operation mode, the control device, based on the second operation mode, enables the first regulator and disables the second regulator, and the first regulator provides the bank with the first current and the second regulator does not provide the bank with and the second current.

In some embodiments, the second operation mode includes a working state of IDD3P of the DRAM.

In some embodiments, magnitude of the first current, provided by the first regulator, in the second operation mode satisfies magnitude of an operation current described in the second operation mode of a spec of the DRAM.

In some embodiments, the control device is further configured to receive a second instruction which indicates that the DRAM is instructed to operate under the second operation mode, and the second regulator is configured not to provide the second current in response to the second instruction.

In some embodiments, the control device is further configured disable the second regulator when the DRAM is instructed to operate under the second operation mode and when the bank of the DRAM is instructed to be activated.

In some embodiments, the control device is further configured to receive an active instruction which indicates that the bank is instructed to be activated, and the second regulator is configured not to provide the second current in response to the second instruction and the active instruction.

In some embodiments, the control device is further configured to receive a first instruction which indicates that the DRAM is instructed to operate under the first operation mode, and the second regulator is configured to provide the second current in response to the first instruction.

In some embodiments, the control device is further configured enable the second regulator when the DRAM is instructed to operate under the first operation mode and when the bank of the DRAM is instructed to be activated.

In some embodiments, the control device is further configured to receive an active instruction which indicates that the bank is instructed to be activated, and the second regulator is configured to provide the second current in response to the first instruction and the active instruction.

In some embodiments, the first regulator and the second regulator are integrated.

Another aspect of the present disclosure provides a voltage system of a DRAM. The regulator provides a current which serves as an operation current of a bank of the DRAM by being enabled when the DRAM is instructed to operate under a first operation mode, and does not provide the current when the DRAM is instructed to operate under a second operation mode including a working state of IDD3P of the DRAM.

In some embodiments, the voltage system further includes a control device configured to receive a second instruction which indicates that the DRAM is instructed to operate under the second operation mode, and the regulator is configured not to provide the current in response to the second instruction.

In some embodiments, the control device is further configured disable the regulator when the DRAM is instructed to operate under the second operation mode and when the bank of the DRAM is instructed to be activated.

In some embodiments, the control device is further configured to receive an active instruction which indicates that the bank is instructed to be activated, and the regulator is configured not to provide the current in response to the second instruction and the active instruction.

In some embodiments, the voltage system further includes a control device configured to receive a first instruction which indicates that the DRAM is instructed to operate under the first operation mode, and the regulator is configured to provide the current in response to the first instruction.

In some embodiments, the control device is further configured enable the regulator when the DRAM is instructed to operate under the first operation mode and when the bank of the DRAM is instructed to be activated.

In some embodiments, the control device is further configured to receive an active instruction which indicates that the bank is instructed to be activated, and the regulator is configured to provide the current in response to the first instruction and the active instruction.

Another aspect of the present disclosure provides a method of operating a voltage system of a DRAM. The method includes determining the amount of regulators of the voltage system required based on an operation mode which the DRAM is instructed to operate; enabling one or more regulators of the voltage system and disabling the remaining regulators of the voltage system based on the determination;

and providing a current which serves an operation current of a bank of the DRAM by the enabled one or more regulators.

In some embodiments, the operation mode includes a working state of IDD3P of the DRAM.

In the present disclosure, the regulator can be disabled when the DRAM is instructed to operate under the second operation mode in which an operation current for the bank is not required. As a result, the DRAM's power draw is relatively efficient.

In contrast, in a comparative DRAM, once a bank of the DRAMs is instructed to be activated, a regulator of the DRAM provides that bank with an operation current despite that the operation current for the bank is required or is not required. In some operation modes of the DRAMs, the operation current may not be required. However, the regulator is still enabled. To let the regulator work when the regulator is enabled, some bias voltage and bias current are required, resulting in power usage inefficiency.

Moreover, in the present disclosure, with the control device, the amount of regulators required can be determined based on the first instruction Int which indicates that the DRAM is instructed to operate under the second operation mode. The DRAM enables one regulator (the first regulator) and disables the remaining regulators (the second regulator), based on the determination. Although the second regulator is disabled, current only provided by the first regulator is sufficient to satisfy the requirement of the second operation mode described in the spec. Therefore, in this way, power usage of the DRAM is relatively efficient.

In contrast, in the comparative DRAM, once a bank of the comparative DRAM is instructed to be activated, a first regulator and a second regulator of the comparative DRAM, in combination, provide the bank with current despite that magnitude of the sum of the currents provided by the first regulator and the second regulator exceed the magnitude of an operation current of an operation mode described in a spec of the comparative DRAM. To let the first regulator and the second regulator work when the first regulator and the second regulator are enabled, some bias voltages and bias currents are required. Inefficient power usage results.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the conception and specific embodiments disclosed may be readily utilized as a basis for modifying or designing other structures or processes for carrying out the purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled with" another element, the initial element may be directly connected to, or coupled to, another element, or to other intervening elements.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
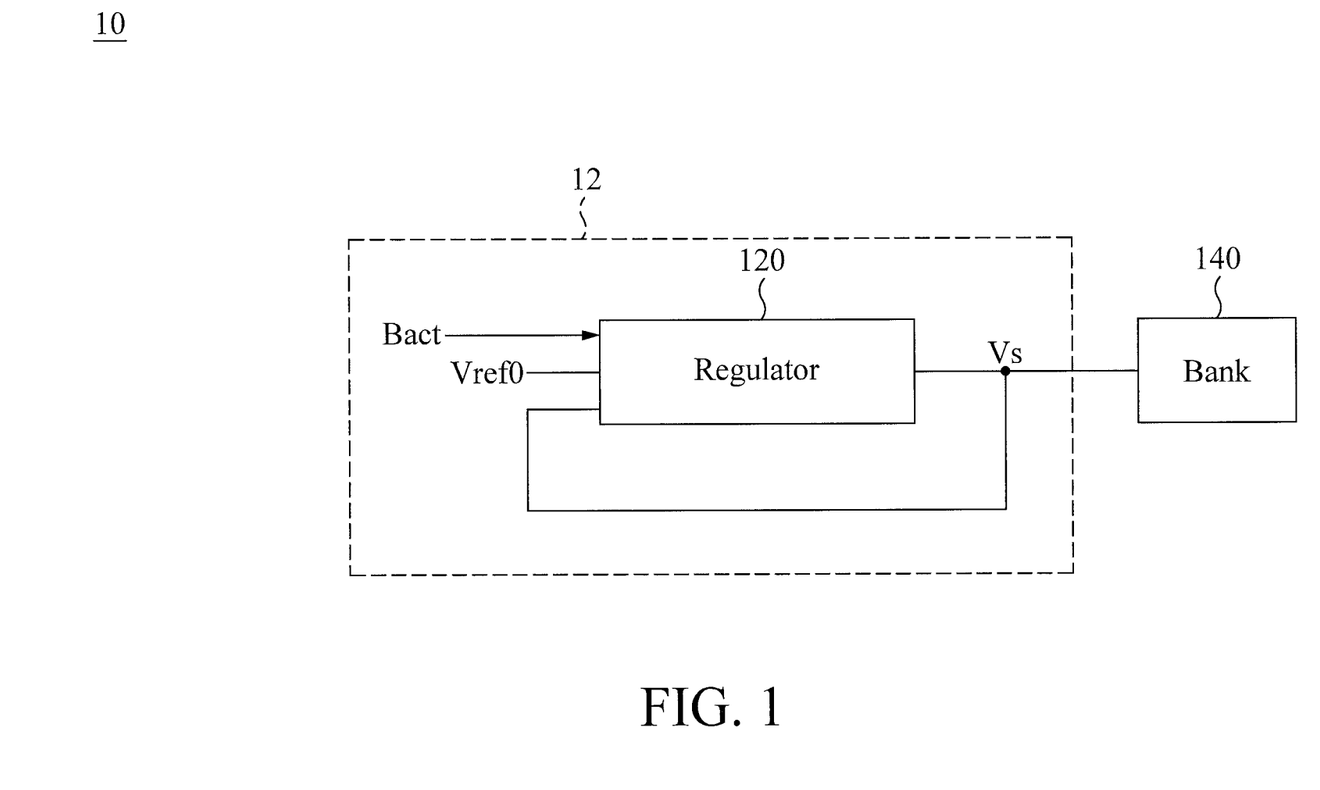
FIG. 1 is a schematic diagram of a comparative dynamic random access memory (DRAM) including a voltage system.

FIG. 1 is a schematic diagram of a comparative dynamic random access memory (DRAM) 10 including a voltage system 12. Referring to FIG. 1, the DRAM 10 further includes a bank 140 in addition to the voltage system 12. The bank 140 includes a plurality of memory cells (not shown) that used to store data. For clarity of discussion, the bank 140 is identified and illustrated as a single device. However, the bank 140 may alternatively represent an assembly which includes a plurality of the banks 140.

The voltage system 12 includes a regulator 120. The regulator 120 is configured for providing a current and a supply voltage Vs serving as an operation current and as an operation voltage of the bank 140, respectively, when the regulator 120 is enabled. In further detail, the regulator 120 is enabled in response to an active instruction Bact which indicates that the bank 140 is instructed to be activated. The bank 140 is instructed to be activated so as to perform, for example, a read operation, a write operation, a refresh operation, or other suitable operations on the bank 140.

Moreover, the regulator 120 keeps the supply voltage Vs stable by comparing a voltage level of the supply voltage Vs to a reference voltage level Vref0. In further detail, when the regulator 120 is enabled, the regulator 120 charges a capacitor (not shown), thereby increasing a voltage level of the supply voltage Vs. When the increased voltage level of the supply voltage Vs is greater than the reference voltage level Vref0, the regulator 120 stops charging the capacitor. Subsequently, the voltage level of the supply voltage Vs may decrease. When the decreased voltage level of the supply voltage Vs is less than the reference voltage level Vref0, the regulator 120 starts charging the capacitor again. By these repeated comparisons, a voltage level of the voltage level Vs is kept at a desired voltage level.

Once the bank 140 is instructed to be activated, the regulator 120 provides the bank 140 with the operation current despite that the operation current for the bank 140 is required or is not required. In some operation modes of the DRAM 10, the operation current may not be required. However, the regulator 120 would still be enabled. To let the regulator 120 work when the regulator 120 is enabled, some bias voltages and some bias currents are required, resulting in inefficiency of power usage.

Figure 2:
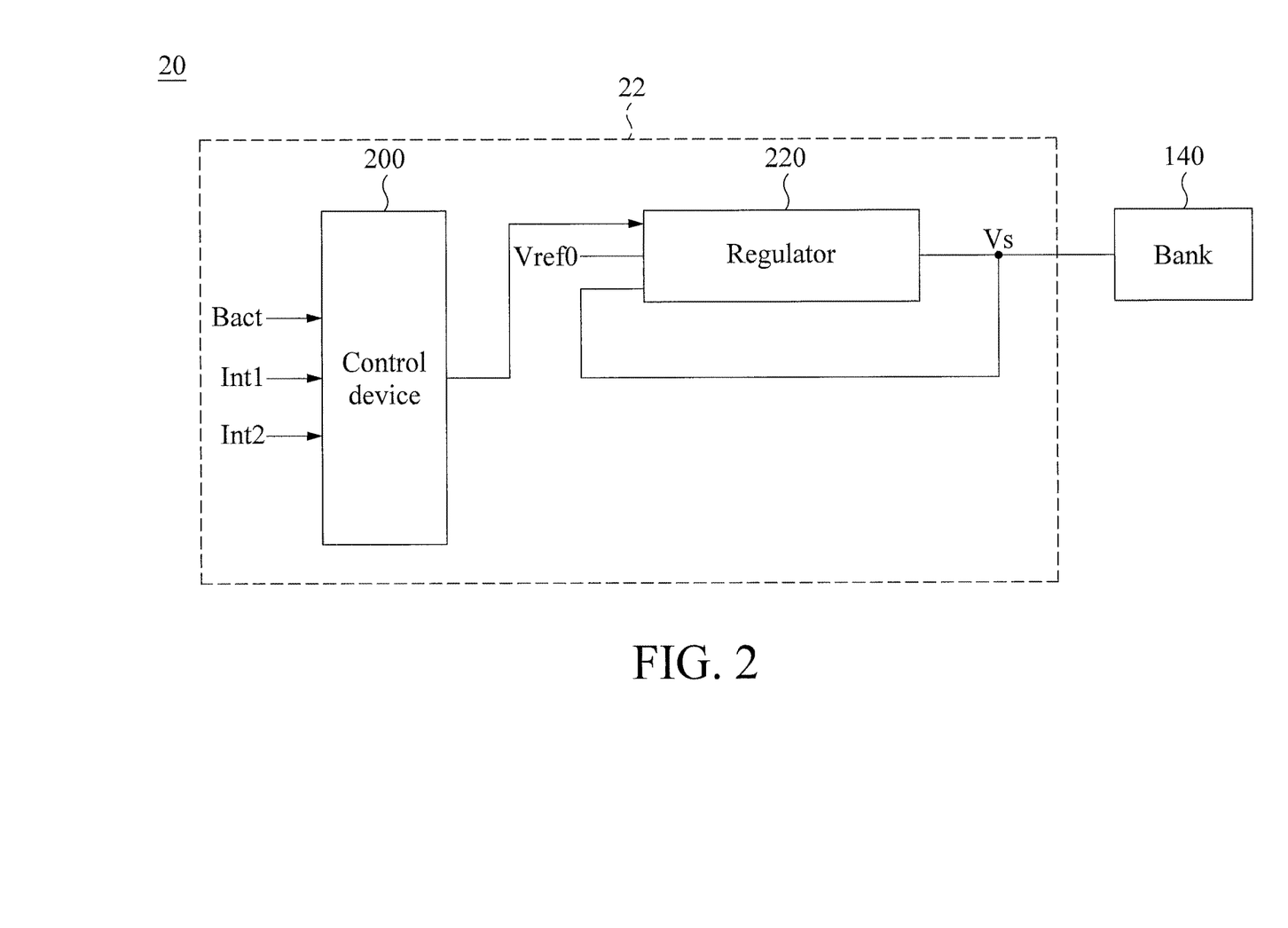
FIG. 2 is a schematic diagram of a DRAM including a voltage system, in accordance with some embodiments of the present disclosure.

FIG. 2 is a schematic diagram of a DRAM 20 including a voltage system 22, in accordance with some embodiments of the present disclosure. Operation modes of the DRAM 20 include a first operation mode and a second operation mode. In the first operation mode, an operation current is required for the bank 140. In the second operation mode, the operation current is not required for the bank 140. In an embodiment, the second operation mode includes a working state of IDD3P of the DRAM 20. Working states of a DRAM are well known in the art; for example, in a publication entitled "Technical Note, DDR2 tCKE Power-Down Requirement" published on 2003, which is incorporated herein by reference in its entirety. In the publication, the IDD3P refers to one of power-down modes, in particular, an active power down mode.

Referring to FIG. 2, the voltage system 22 is similar to the voltage system 12 described and illustrated with reference to FIG. 1 except that, for example, the voltage system 22 further includes a control device 200 and a regulator 220.

The control device 200 receives an active instruction Bact which indicates that the bank 140 is instructed to be activated so as to perform, for example, a read operation, a write operation, a refresh operation, or other suitable operations on the bank 140. Moreover, the control device 200 receives a first instruction Int1 which indicates that the DRAM 20 is instructed to operate under a first operation mode, and enables the regulator 220 in response to the first instruction Int1 and the active instruction Bact; alternatively, the control device 200 receives a second instruction Int2 which indicates that the DRAM 20 is instructed to operate under a second operation mode, and disables the regulator 220 in response to the second instruction Int2 and the active instruction Bact.

The regulator 220 is configured to provide a current serving as an operation current for the bank 140 by being enabled, and does not provide the current by being disabled.

In operation, as previously mentioned, the DRAM 20 includes two operation modes, the first operation mode and the second operation mode. In the first operation mode, the control device 200 receives the active instruction Bact and the first instruction Int1. Because of receiving the first instruction Int1 instead of the second instruction Int2, the control device 200 passes the active instruction Bact to the regulator 220. In that case, the regulator 220 is enabled in response to the active instruction Bact, which will be described in detail with references to FIG. 3.

In the second operation mode, the control device 200 receives the active instruction Bact and the second instruction Int2. Because of receiving the second instruction Int2 instead of the first instruction Int1, the control device 200 does not pass the active instruction Bact to the regulator 220. In that case, the regulator 220 does not provide the bank 140 with the current in response to the active instruction Bact and the second instruction Int2, which will be described in detail with reference to FIG. 4. Therefore, in a circumstance where the operation current is not required, the regulator 220 is no longer enabled. As a result, power usage of the DRAM 20 is relatively efficient.

Figure 3:
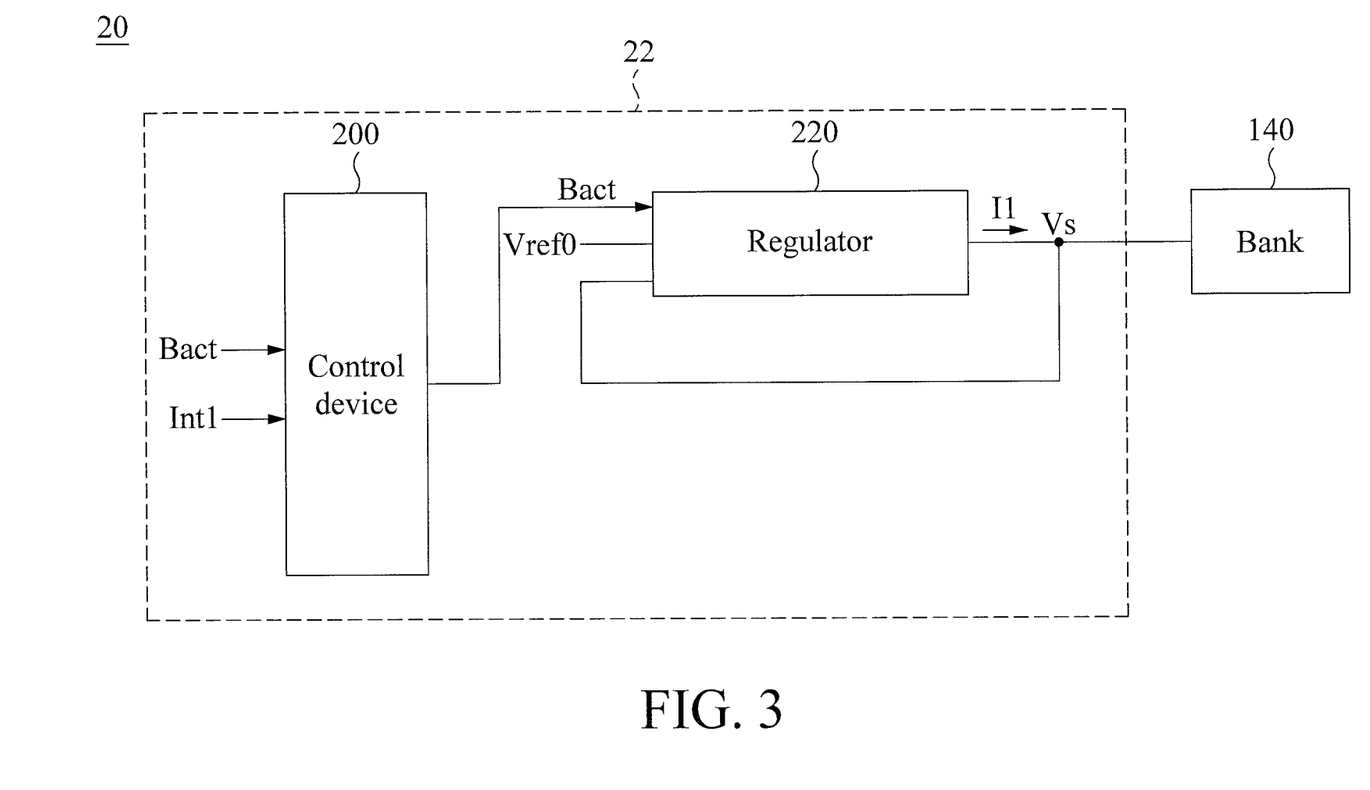
FIG. 3 is a schematic diagram illustrating a first operation mode of the DRAM shown in FIG. 2, in accordance with some embodiments of the present disclosure.

FIG. 3 is a schematic diagram illustrating the first operation mode of the DRAM 20 shown in FIG. 2, in accordance with some embodiments of the present disclosure. Referring to FIG. 3, the control device 200 receives the active instruction Bact, and the first instruction Int1 instead of the second instruction Int2. The control device 200 passes the active instruction Bact to the regulator 220. The regulator 220 is enabled and provides the bank 140 with a current I1 which serves as an operation current of the bank 140 in response to the active instruction Bact and the first instruction Int1.

Figure 4:
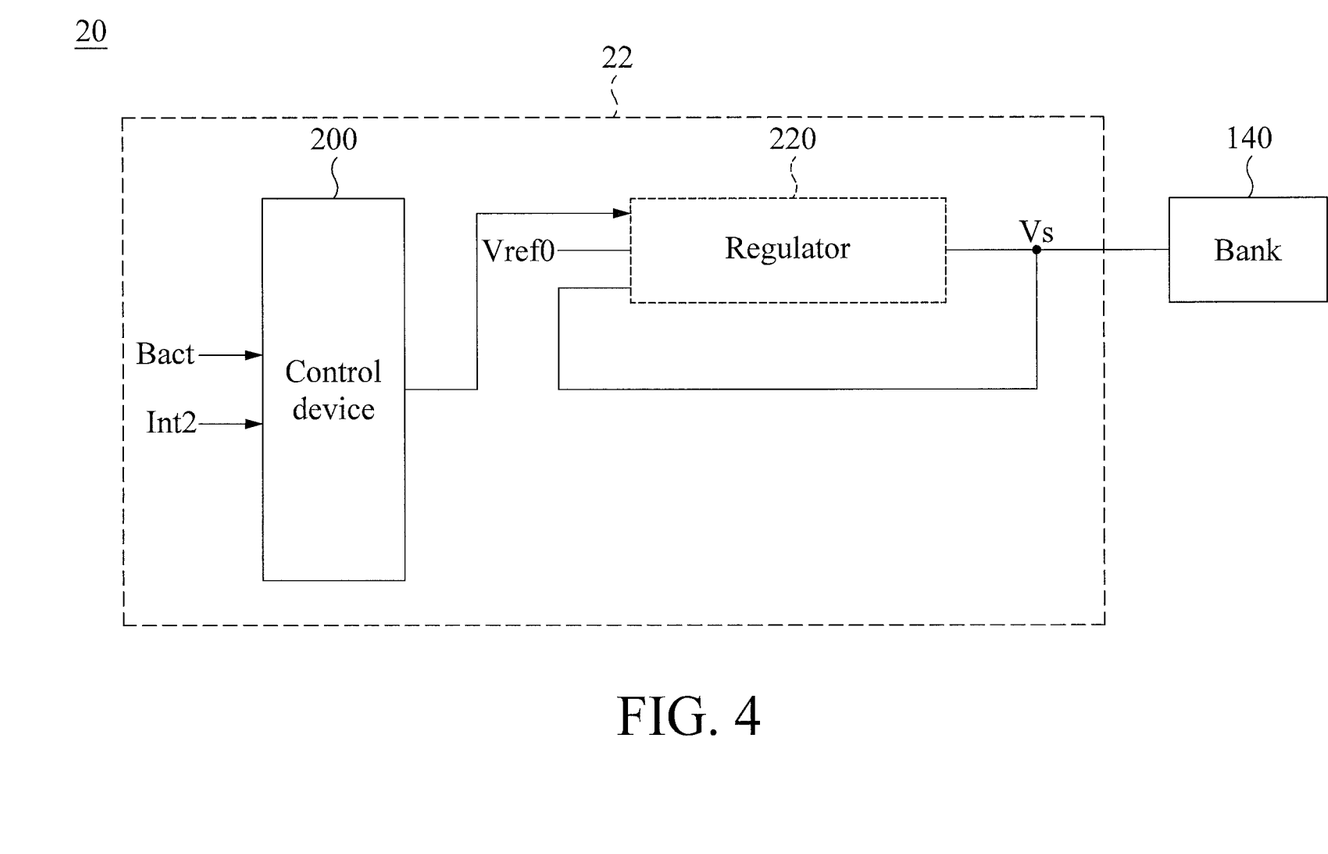
FIG. 4 is a schematic diagram illustrating a second operation mode of the DRAM shown in FIG. 2, in accordance with some embodiments of the present disclosure.

FIG. 4 is a schematic diagram illustrating the second operation mode of the DRAM 20 shown in FIG. 2, in accordance with some embodiments of the present disclosure. Referring to FIG. 4, the control device 200 receives the active instruction Bact, and the second instruction Int2 instead of the first instruction Int1. The control device 200 does not pass the active instruction Bact to the regulator 220, thereby disabling the regulator 220. The regulator 220 is disabled in response to the active instruction Bact and the second instruction Int2.

In the present disclosure, the regulator 220 can be disabled when the DRAM 20 is instructed to operate under the second operation mode in which an operation current for the bank 140 is not required as previously mentioned. As a result, power usage of the DRAM 20 is relatively efficient.

Figure 5:
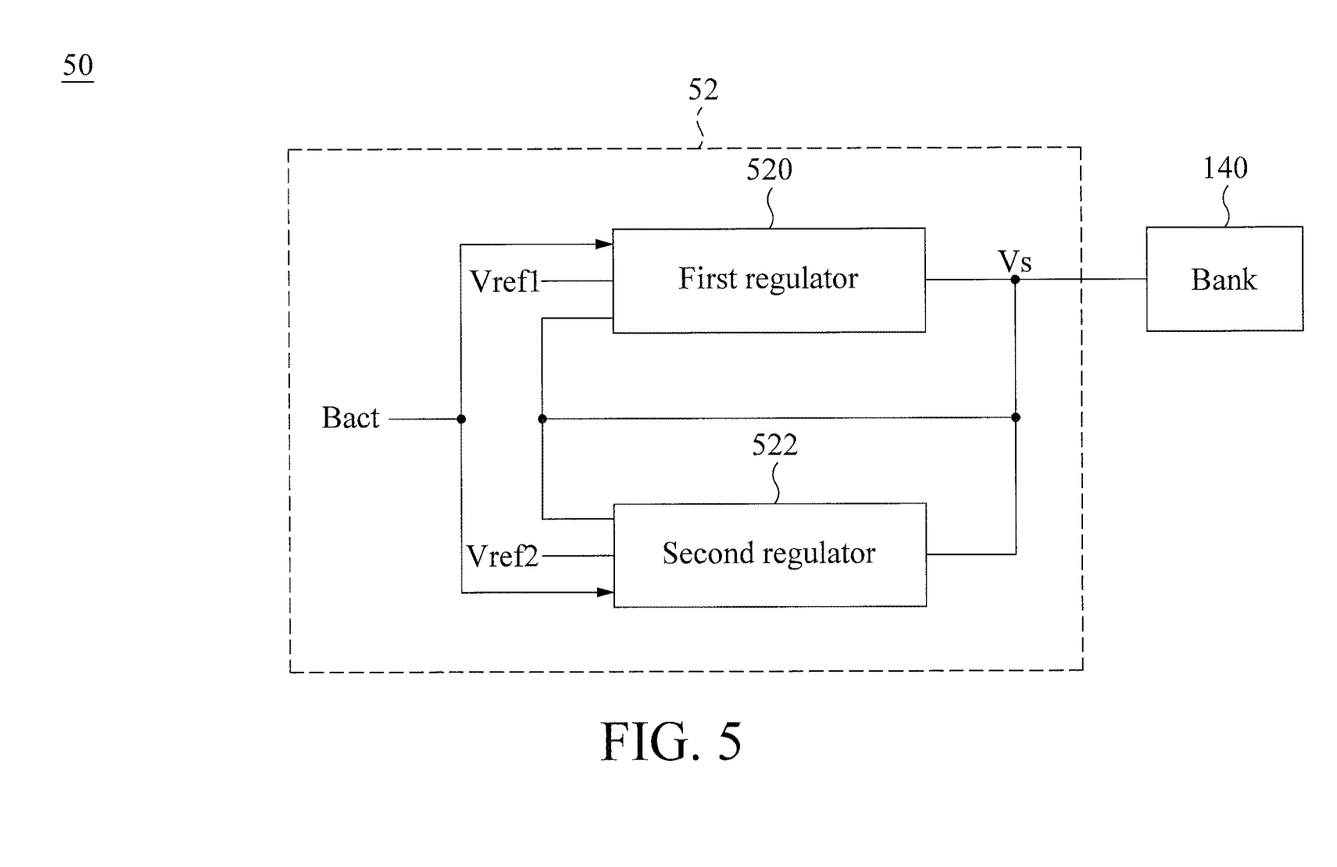
FIG. 5 is a schematic diagram of a comparative DRAM including a voltage system.

FIG. 5 is a schematic diagram of a comparative DRAM 50 including a voltage system 52. Referring to FIG. 5, the voltage system 52 is similar to the voltage system 12 described and illustrated with reference to FIG. 1 except that, for example, the voltage system 52 includes a first regulator 520 and a second regulator 522. For convenience of discussion, the regulator 120 of FIG. 1 is renamed and renumbered as the first regulator 520; and the reference voltage level Vref0 is renamed as the first reference voltage level Vref1. The second regulator 522 in operation is the same as the first regulator 520 except that, for example, the second regulator 522 keeps the supply voltage Vs stable by comparing a voltage level of the supply voltage Vs to the second reference voltage level Vref2. Therefore, some detailed operations are omitted herein.

The first and second regulators 520 and 522 each functions to provide a current serving as an operation current of the bank 140 when the first and second regulators 520 and 522 are enabled. In further detail, the first and second regulators 520 and 522 receive an active instruction Bact which indicates that the bank 140 is instructed to be activated, and are accordingly enabled in response to the active instruction Bact, which will be described and illustrated in detail with reference to FIG. 6.

Figure 6:
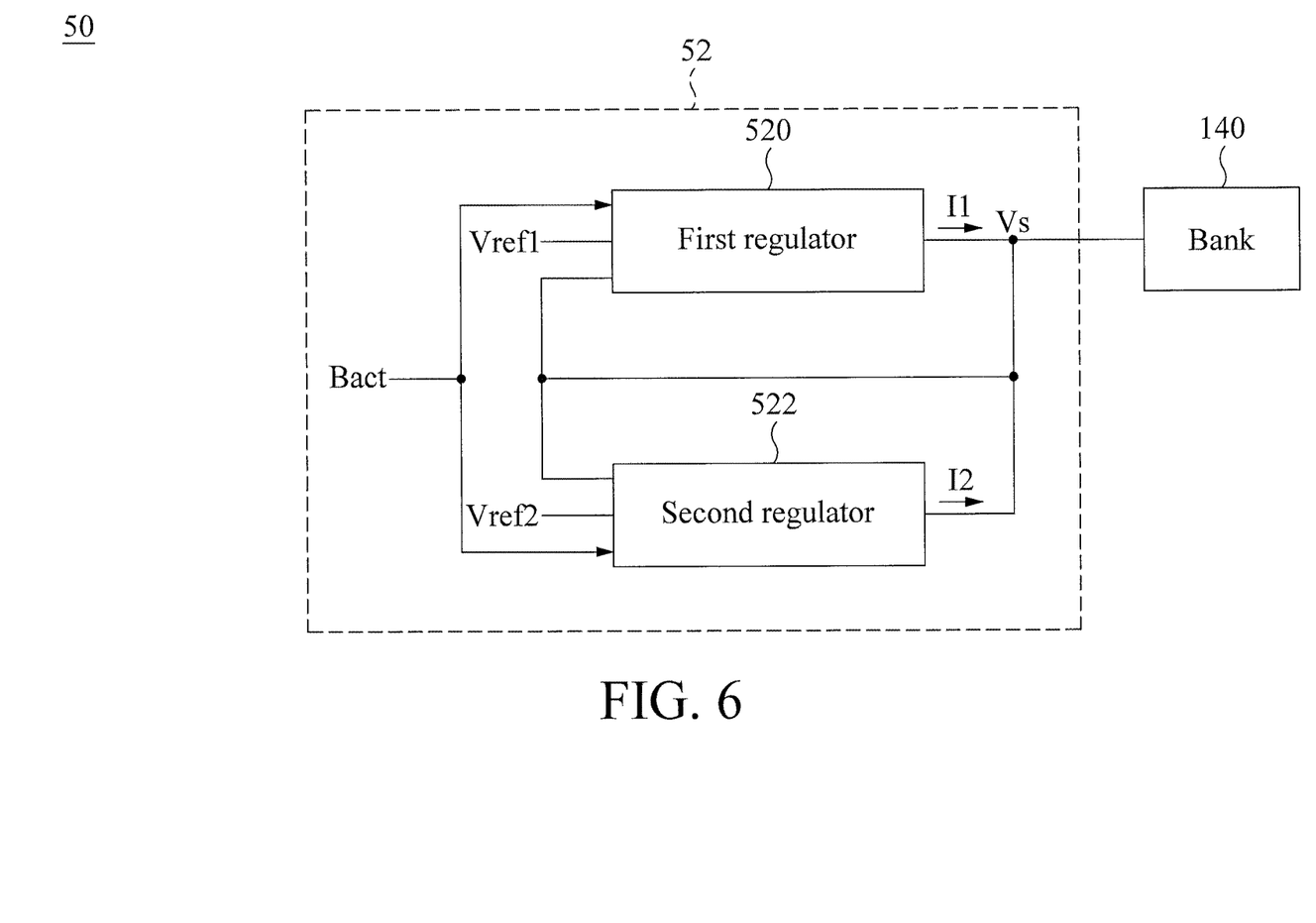
FIG. 6 is a schematic diagram illustrating an operation of the comparative DRAM shown in FIG. 5.

FIG. 6 is a schematic diagram illustrating an operation of the comparative DRAM 50 shown in FIG. 5. Referring to FIG. 6, the first regulator 520 provides a first current I1 serving as a first portion of the operation current for the bank 140. Similarly, the second regulator 522 provides a second current I2 severing a second portion of the operation current for the bank 140.

Once the bank 140 is instructed to be activated, the first regulator 520 and the second regulator 522 provides the bank 140 with the currents I1 and I2 despite that magnitude of the sum of the currents I1 and I2 exceeds magnitude of an operation current of an operation mode described in a spec of the DRAM 50. For example, a spec of the DRAM 50 states that an operation current in an operation mode is 1 milliampere (mA). That is, when the DRAM 50 is instructed to operate under the operation mode, 1 mA is only required. Moreover, each of the first regulator 520 and the second regulator 522 are designed to provide 1 mA. In that case, when the first regulator 520 and the second regulator 522 are enabled, the first regulator 520 and the second regulator 522, in common, provide 2 mA which exceeds 1 mA. To let the first regulator 520 and the second regulator 522 work to provide 2 mA, some bias voltages and some bias currents are required, resulting in inefficient power usage. A possible way to increase efficient power usage is to turn off one of the first regulator 520 and the second regulator 522 when the DRAM 50 is instructed to operate under the operation mode.

Figure 7:
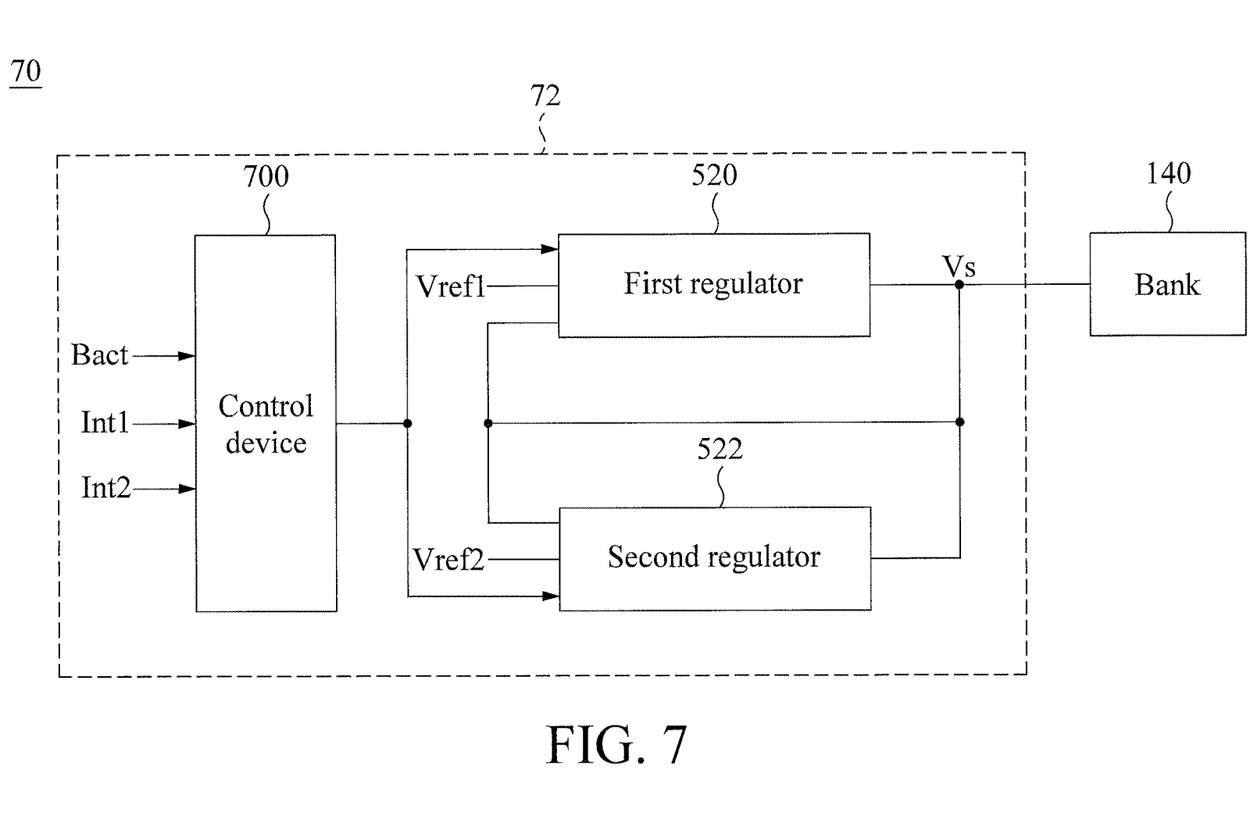
FIG. 7 is a schematic diagram of a DRAM including a voltage system, in accordance with some embodiments of the present disclosure.

FIG. 7 is a schematic diagram of a DRAM 70 including a voltage system 72, in accordance with some embodiments of the present disclosure. Referring to FIG. 7, the voltage system 72 is similar to the voltage system 52 described and illustrated with reference to FIG. 8 except that, for example, the voltage system 72 includes a control device 700.

Figure 8:
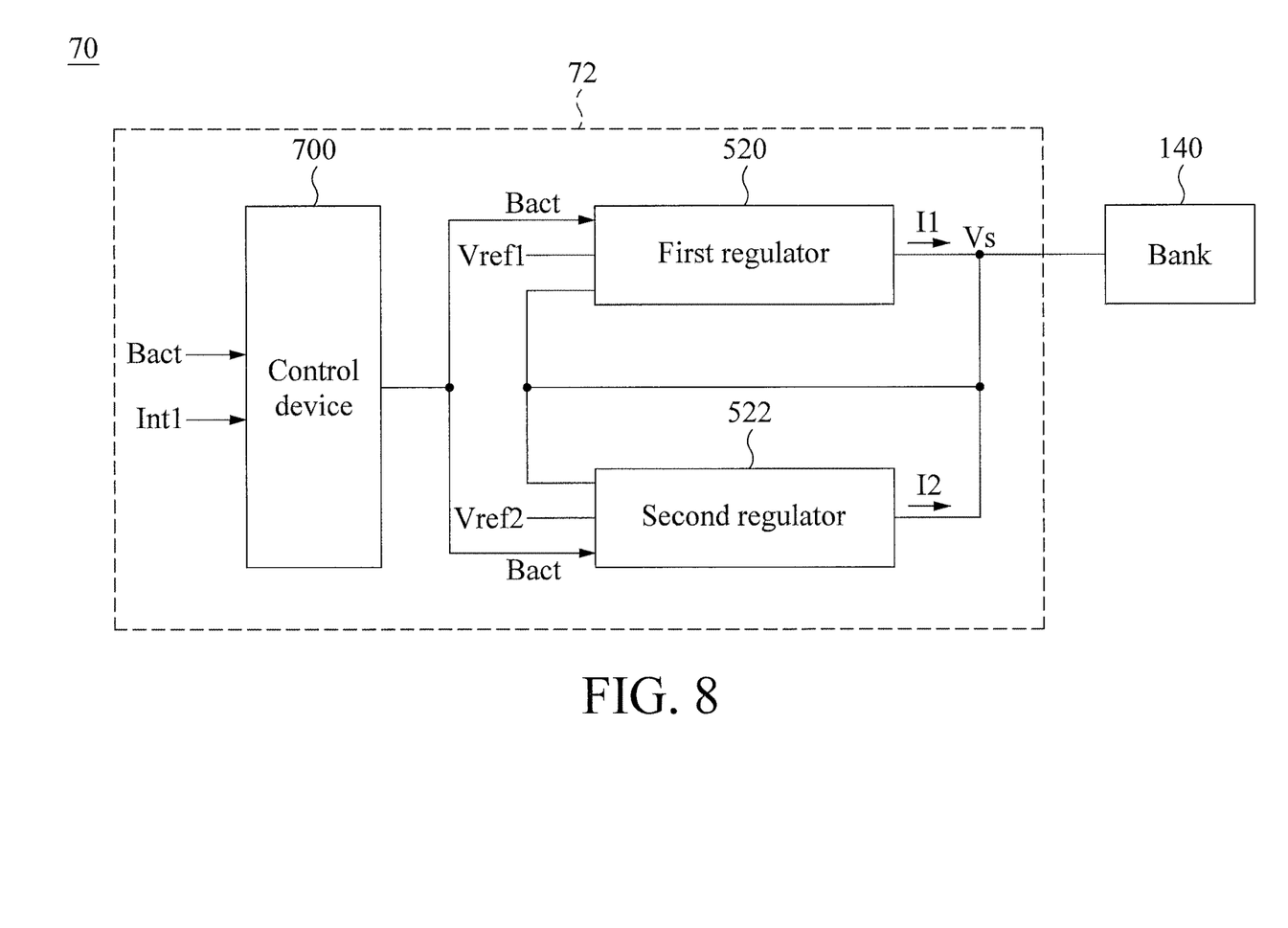
FIG. 8 is a schematic diagram illustrating a first operation mode of the DRAM of FIG. 7, in accordance with some embodiments of the present disclosure.
Figure 9:
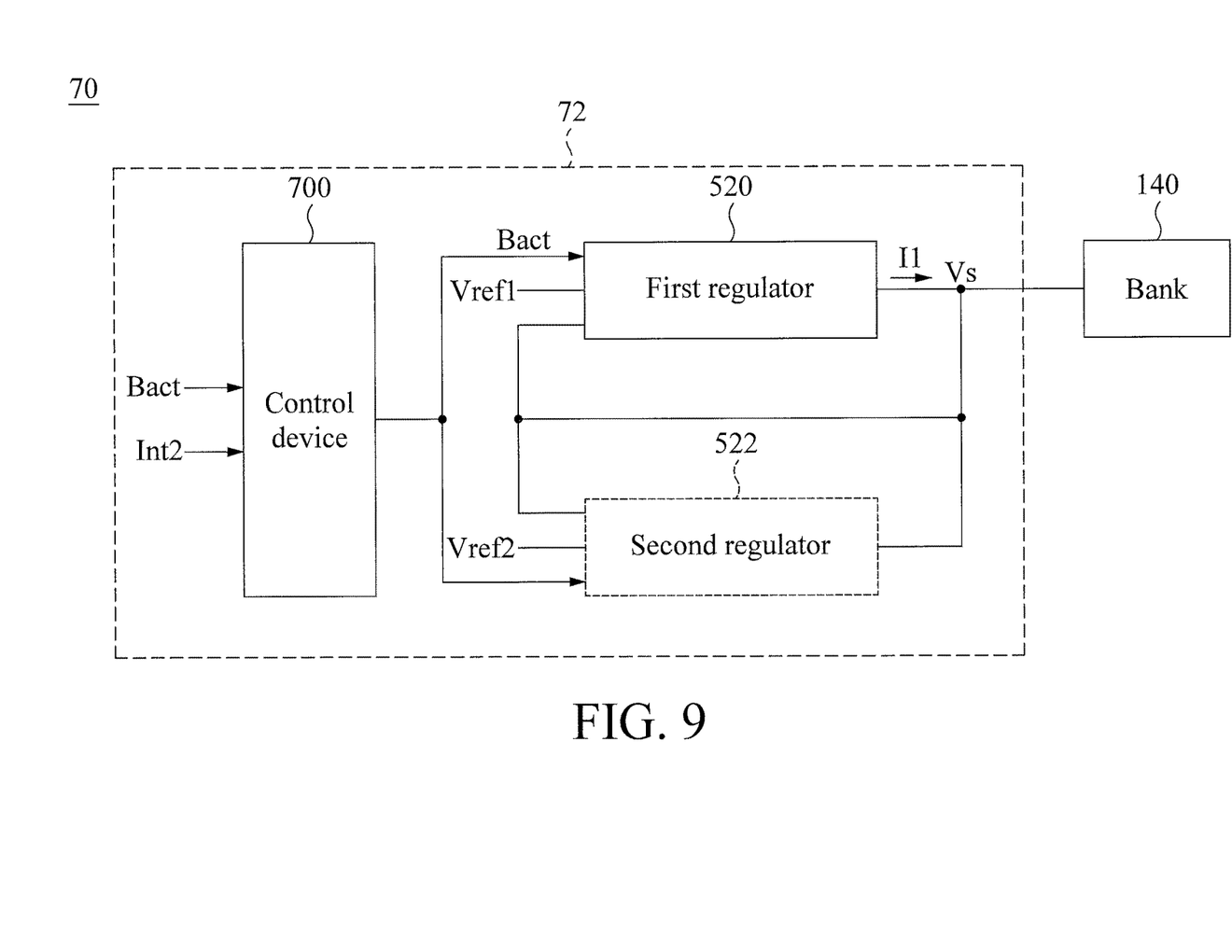
FIG. 9 is a schematic diagram illustrating a second operation mode of the DRAM of FIG. 7, in accordance with some embodiments of the present disclosure.

The control device 700 in operation is similar to the control device 200 described and illustrated with references to FIGS. 2 to 4 except that, the control device 700 is further configured to determine the amount of regulators required based on an operation mode which the DRAM 70 is instructed to operate under, and enables regulators based on the determination, wherein the amount of the enabled regulators is equal to the determined amount of regulators required, which will be described in detail with reference to FIGS. 8 to 9. With the control device 700, power usage of the DRAM 70 is relatively efficient, which will be described in detail with references to FIGS. 8 and 9.

Moreover, the first regulator 520 is configured to provide a first current I1 which serves as an operation current for the bank 140, and the second regulator 522 is configured to provide a second current I1 which serves as an operation current for the bank 140. In an embodiment, the first regulator 520 and the second regulator 522 are independent of each other. In another embodiment, the first regulator 520 and the second regulator 522 are integrated.

FIG. 8 is a schematic diagram illustrating a first operation mode of the DRAM 70 of FIG. 7, in accordance with some embodiments of the present disclosure. Referring to FIG. 8, the control device 200 receives the active instruction Bact, and the first instruction Int1 instead of the second instruction Int2. The control device 700 determines the amount of regulators required based on the first instruction Int1 which indicates that the DRAM 70 is instructed to operate under the first operation mode. For example, the control device 700 includes a lookup table. The control device 700 determines the amount of regulators required by indexing the lookup table with first instruction Int1. For further clarification, it is assumed that each of the first regulator 520 and the second regulator 522 provides 1 milliampere (mA). Moreover, a spec of the DRAM 70 states that an operation current in the first operation mode is 2 mA. Therefore, the control device 700 determines that the amount of regulators required is two. In that case, the control device 700 passes the active instruction Bact to the first regulator 520 and the second regulator 522 so as to enable two regulators, the first regulator 520 and the second regulator 522. The first regulator 520 and the second regulator 522 provides the bank 140 with the first current I1 and the second current I2 which serve as an operation current of the bank 140 in response to the active instruction Bact and the first instruction Int1.

It should be noted that although a path between an output and an input of the second regulator 520 (or between an output and an input of the first regulator 522) is depicted, this does not mean that the first current I1 and the second current I2 conduct through such a path. Such a path is used to transmit voltage signals. It is not used to transmit any current. That is, the first current I1 and the second current I2 entirely flow into the bank 140.

FIG. 9 is a schematic diagram illustrating the second operation mode of the DRAM 70 of FIG. 7, in accordance with some embodiments of the present disclosure. In an embodiment, the second operation mode includes a working state of IDD3P of the DRAM 70. Referring to FIG. 9, the control device 700 receives the active instruction Bact, and the second instruction Int2 instead of the first instruction Int1. The control device 700 determines the amount of regulators required based on the second instruction Int2 which indicates that the DRAM 70 is instructed to operate under the second operation mode. For further clarification, it is assumed that each of the first regulator 520 and the second regulator 522 provides 1 mA. Moreover, a spec of the DRAM 70 states that an operation current in the second operation mode is 1 mA. Therefore, the control device 700 determines that the amount of regulators required is one. In that case, the control device 700 passes the active instruction Bact to one of the first regulator 520 and the second regulator 522 (in the present embodiment, to the first regulator 520 only) so as to enable one regulator, the first regulator 520, and disable the remaining regulators, the second regulator 522. The second regulator 522 is disabled in response to the active instruction Bact and the second instruction Int2. Effectively, magnitude of the first current I1, provided by the first regulator 520 satisfies magnitude of an operation current described in the second operation mode of a spec of the DRAM 70.

In the present embodiment, the control device 700 only enables one regulator. However, the present disclosure is not limited thereto. For example, if it is determined that the amount of regulators required is two, the DRAM 70 enables the first regulator 520 and the second regulator 522, and disabling the remaining regulators (not shown) of the voltage system 72.

In the present disclosure, with the control device 700, the amount of regulators required can be determined based on an operation mode which the DRAM 70 is instructed to operate under. As a result, power usage of the DRAM 70 is relatively efficient. In particular, when the DRAM 70 is instructed under an IDD3P mode, only the first regulator 520 is enabled. As a result, power usage of the DRAM 70 is efficient under the IDD3P mode.

Figure 10:
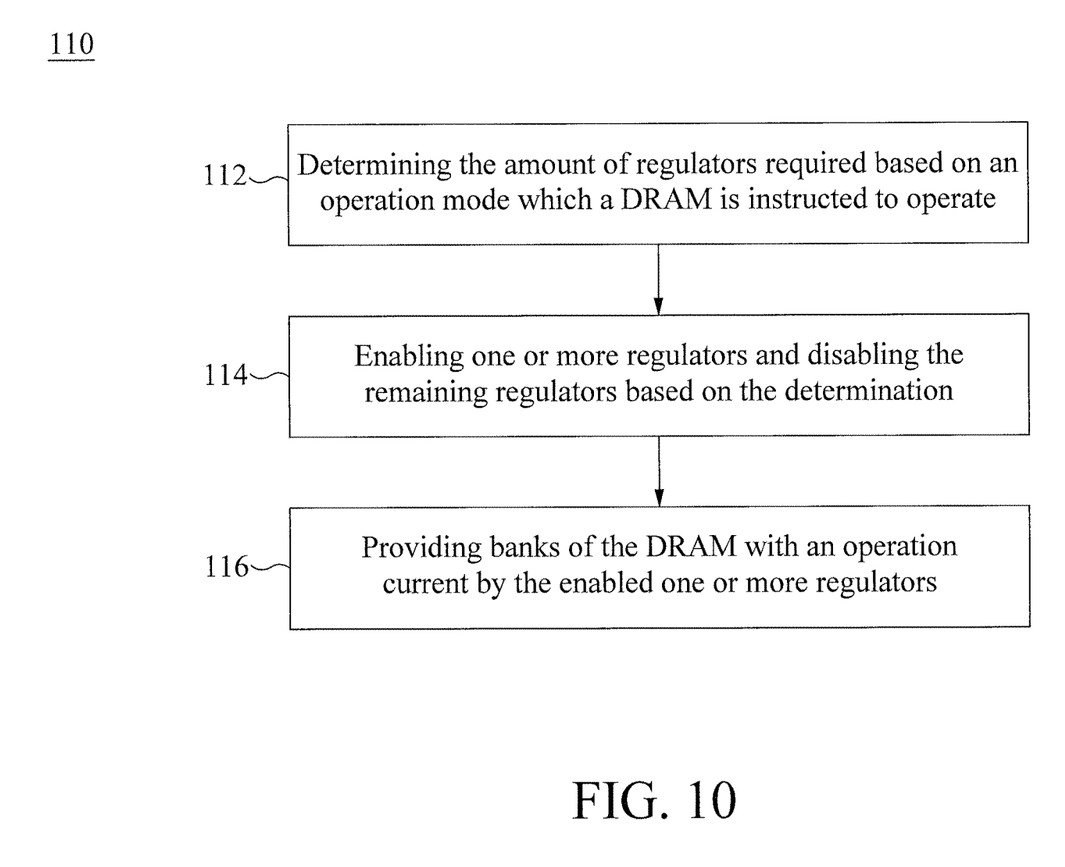
FIG. 10 is a flow diagram of a method for operating a voltage system, in accordance with some embodiments of the present disclosure.

FIG. 10 is a flow diagram of a method 110 for operating a voltage system, in accordance with some embodiments of the present disclosure. Referring to FIG. 10, the method 110 includes operations 112, 114 and 116. The method 110 begins with operation 112, in which the amount of regulators required is determined based on an operation mode which a DRAM is instructed to operate under. The method 110 then continues with operation 114, in which one or more regulators of the DRAM are enabled and the remaining regulators of the DRAM are disabled based on the determination. The method 110 then proceeds to operation 116, in which banks of the DRAM are provided with an operation current by the one or more enabled regulators.

In the present disclosure, the regulator 120 can be disabled when the DRAM 20 is instructed to operate under the second operation mode in which an operation current for the bank 140 is not required. As a result, power usage of the DRAM 20 is relatively efficient.

In contrast, in the comparative DRAM 10, once a bank 140 of the DRAMs 10 is instructed to be activated, a regulator 120 of the DRAMs provides the bank 140 with an operation current despite that the operation current for the bank 140 is required or is not required. In some operation modes of the DRAMs 10, the operation current may not be required. However, the regulator 120 will still be enabled. To let the regulator 120 work when the regulator 120 is enabled, some bias voltages and some bias currents are required, resulting in inefficiency in power usage.

In the present disclosure, with the control device 700, the amount of regulators required is able to be determined based on the second instruction Int2 which indicates that the DRAM 70 is instructed to operate under the second operation mode. The DRAM 70 enables one regulator (the first regulator 520) and disables the remaining regulators (the second regulator 522) based on the determination. Although the second regulator 522 is disabled, current only provided by the first regulator 520 is sufficient to satisfy the requirement of the second operation mode described in the spec. Therefore, in this way, power usage of the DRAM 70 is relatively efficient.

In contrast, in the comparative DRAM 50, once the bank 140 is instructed to be activated, the first regulator 520 and the second regulator 522 provides the bank 140 with the currents I1 and I2 despite that magnitude of sum of the currents I1 and I2 exceeds magnitude of an operation current of an operation mode described in a spec of the DRAM 50. To let the first regulator 520 and the second regulator 522 work, some bias voltages and some bias currents are required, resulting in inefficiency in power usage.

One aspect of the present disclosure provides a voltage system of a DRAM. The voltage system includes a first regulator, a second regulator and a control device. The control device determines the amount of regulators required based on an operation mode which the DRAM is instructed to operate under, and, based on the determination, enables one or more regulators between the first regulator and the second regulator and disables the remaining regulators. The amount of the one or more enabled regulators is equal to the determined amount of regulators required. The one or more enabled regulators provide a current which serves as an operation current of a bank of the DRAM.

Another aspect of the present disclosure provides a voltage system of a DRAM. The regulator provides a current which serves as an operation current of a bank of the DRAM by being enabled when the DRAM is instructed to operate under a first operation mode, and does not provide the current when the DRAM is instructed to operate under a second operation mode including a working state of IDD3P of the DRAM.

Another aspect of the present disclosure provides a method of operating a voltage system of a DRAM. The method includes determining the amount of regulators of the voltage system required based on an operation mode which the DRAM is instructed to operate; enabling one or more regulators of the voltage system and disabling the remaining regulators of the voltage system based on the determination; and providing a current which serves an operation current of a bank of the DRAM by the enabled one or more regulators.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A voltage system of a DRAM, comprising:
    a first regulator;
    a second regulator; and
    a control device configured to determine the amount of regulators required based on an operation mode which the DRAM is instructed to operate under, and, based on the determination, receive an active instruction and a first instruction so as to pass the active instruction to the first regulator and the second regulator and enable the first regulator and the second regulator, or receive the active instruction and a second instruction so as to pass the active instruction to one of the first regulator and the second regulator and enable one of the first regulator and the second regulator, which receives the active instruction, and disable the remaining regulator, wherein the amount of the enabled regulators is equal to the determined amount of regulators required,
    wherein the one or more enabled regulators provide a current which serves as an operation current of a bank of the DRAM.

2. The voltage system of claim 1,
wherein when the operation mode is a first operation mode, the control device, based on the first operation mode, enables the first regulator and the second regulator, and the first regulator and the second regulator provides the bank with a first current and a second current, respectively,
wherein when the operation mode is a second operation mode different from the first operation mode, the control device, based on the second operation mode, enables the first regulator and disables the second regulator, and the first regulator provides the bank with the first current and the second regulator does not provide the bank with and the second current.

3. The voltage system of claim 2, wherein the second operation mode includes an active power down mode of the DRAM.

4. The voltage system of claim 2, wherein magnitude of the first current, provided by the first regulator, in the second operation mode satisfies magnitude of an operation current described in the second operation mode of a spec of the DRAM.

5. The voltage system of claim 2, wherein the control device is further configured to receive the second instruction which indicates that the DRAM is instructed to operate under the second operation mode, and the second regulator is configured not to provide the second current in response to the second instruction.

6. The voltage system of claim 5, wherein the control device is further configured disable the second regulator when the DRAM is instructed to operate under the second operation mode and when the bank of the DRAM is instructed to be activated.

7. The voltage system of claim 6, wherein the control device is further configured to receive the active instruction which indicates that the bank is instructed to be activated, and the second regulator is configured not to provide the second current in response to the second instruction and the active instruction.

8. The voltage system of claim 2, wherein the control device is further configured to receive the first instruction which indicates that the DRAM is instructed to operate under the first operation mode, and the second regulator is configured to provide the second current in response to the first instruction.

9. The voltage system of claim 8, wherein the control device is further configured enable the second regulator when the DRAM is instructed to operate under the first operation mode and when the bank of the DRAM is instructed to be activated.

10. The voltage system of claim 9, the control device is further configured to receive the active instruction which indicates that the bank is instructed to be activated, and the second regulator is configured to provide the second current in response to the first instruction and the active instruction.

11. The voltage system of claim 1, wherein the first regulator and the second regulator are integrated.

* * * * *